(12) United States Patent
DeBrosse et al.

(10) Patent No.: US 8,456,901 B2
(45) Date of Patent: Jun. 4, 2013

(54) SPIN-TORQUE TRANSFER MAGNETO-RESISTIVE MEMORY ARCHITECTURE

(75) Inventors: John K. DeBrosse, Colchester, VT (US); Yutaka Nakamura, Kyoto-fu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/559,672

(22) Filed: Jul. 27, 2012

(65) Prior Publication Data

US 2012/0294071 A1 Nov. 22, 2012

Related U.S. Application Data

(62) Division of application No. 12/858,879, filed on Aug. 18, 2010.

(51) Int. Cl.
*G11C 11/00* (2006.01)

(52) U.S. Cl.
USPC ............ 365/163; 365/148; 365/171; 977/935

(58) Field of Classification Search
USPC ................. 365/48, 55, 62, 66, 74, 78, 80–93, 365/100, 130, 131, 148, 158, 171–173, 209, 365/213, 225.5, 230.07, 232, 243.5; 216/22; 257/295, 421, E21.665; 438/3; 428/810–816, 428/817–825.1, 826; 977/933–935
See application file for complete search history.

(56) References Cited

U.S. PATENT DOCUMENTS

| | | | |
|---|---|---|---|
| 5,276,641 A | | 1/1994 | Sprogis et al. |
| 5,418,750 A | | 5/1995 | Shiratake et al. |
| 6,331,943 B1 | * | 12/2001 | Naji et al. ................ 365/158 |
| 6,721,198 B2 | | 4/2004 | Kang |
| 7,577,021 B2 | * | 8/2009 | Guo et al. ................ 365/158 |
| 7,885,105 B2 | * | 2/2011 | Li et al. .................... 365/173 |
| 7,936,596 B2 | * | 5/2011 | Li ............................. 365/173 |
| 8,004,881 B2 | * | 8/2011 | Zhu et al. ................. 365/158 |
| 2009/0129143 A1 | * | 5/2009 | Guo et al. ................ 365/158 |
| 2010/0061144 A1 | | 3/2010 | Davierwalla et al. |
| 2010/0080036 A1 | | 4/2010 | Liu et al. |

(Continued)

OTHER PUBLICATIONS

A. Driskill-Smith, et al., STT-RAM—A New Spin on Universal Memory, Future Fab International, Jul. 9, 2007, pp. 28-32, Issue 23, Grandis.

(Continued)

*Primary Examiner* — Harry W Byrne (74) *Attorney, Agent, or Firm* — Cantor Colburn LLP; Vazken Alexanian (57) ABSTRACT

A system includes a processor and a memory array connected to the processor comprising a first memory cell comprising a first magnetic tunnel junction device having a first terminal connected to a first bit line and a second terminal, and a first field effect transistor having a source terminal connected to a second bit line, a gate terminal connected to a word line, and a drain terminal connected to the second terminal of the first magnetic tunnel junction device, and a second memory cell comprising a second magnetic tunnel junction device having a first terminal connected to a third bit line and a second terminal, and a second field effect transistor having a source terminal connected to the second bit line, a gate terminal connected to the word line, and a drain terminal connected to the second terminal of the second magnetic tunnel junction device.

8 Claims, 6 Drawing Sheets

U.S. PATENT DOCUMENTS

2010/0110757 A1    5/2010  Ma et al.
2010/0254181 A1*  10/2010  Chung et al. .................. 365/158
2011/0317468 A1*  12/2011  Terzioglu ........................ 365/96

OTHER PUBLICATIONS

J. Li, et al. An Alternate Design Paradigm for Robust Spin-Torque Transfer Magnetic RAM (STT MRAM) from Circuit/Architecture Perspective, Jan. 19-22, 2009, pp. 841-846, Asia and South Pacific Design Automation Conference, 9B-3, Yokohama, Japan.

K. Chun, et al. A Sub-0.9V Logic-compatible Embedded DRAM with Boosted 3T Gain Cell, Regulated Bit-line Write Scheme and PVT-tracking Read Reference Bias, Symposium on VLSI Circuits Digest of Technical Papers, Jun. 16-18, 2009, pp. 134-135, Minneopolis, MN.

K. Noh, et al., Cell Signal Distribution and Imprint Hybrid Bit Line Architecture, Integrated Ferroelectrics, Jul. 11, 2003, pp. 353-359, vol. 53, Taylor & Francis, Korea.

Office Action—Non-Final for U.S. Appl. No. 12/858,879; Filing Date: Aug. 18, 2010; First Named Inventor: John K. DeBrosse; Mailing Date: Jul. 5, 2012.

Office Action—Restriction/Election for U.S. Appl. No. 12/858,879; Filing Date: Aug. 18, 2010; First Named Inventor: John K. DeBrosse; Byrne, Harry W.; Mailing Date: Mar. 16, 2012.

Y. Huai, Spin-Transfer Torque MRAM (STT-MRAM): Challenges and Prospects, AAPPS Bulletin, Dec. 2008, vol. 18, No. 6, United States.

* cited by examiner

SPIN-TORQUE TRANSFER MAGNETO-RESISTIVE MEMORY ARCHITECTURE

CROSS-REFERENCE TO RELATED APPLICATIONS

This is a divisional application of application Ser. No. 12/858,879, filed Aug. 18, 2010, which is incorporated by reference herein.

FIELD OF INVENTION

The present invention relates to spin-torque transfer magneto-resistive random access memory (STT MRAM) devices.

DESCRIPTION OF RELATED ART

Spin-torque transfer magneto-resistive random access memory (STT MRAM) devices provide fast access time, low cost, high density, and non-volatility. A STT MRAM device provides a magnetization switching scheme that does not use a magnetic filed for orientating the relative magnetism of the device.

Data is written to memory cells of the device by using a spin-polarized current to change the orientation of the magnetization of a magnetic layer in a tunnel magneto-resistive element. The spin-polarized current includes electrons with a majority of electrons having a particular spin and may be induced by passing current through a magnetic layer of a device.

It is desirable for a device to minimize power consumption while maintaining a dense arrangement of cells.

BRIEF SUMMARY

In one aspect of the present invention, memory system includes a processor and a memory array communicatively connected to the processor, the memory array includes a first memory cell including a first magnetic tunnel junction device having a first terminal connected to a first bit line ($BLT_E$) and a second terminal, and a first field effect transistor (FET) having a source terminal connected to a second bit line (BLC), a gate terminal connected to a word line (WL), and a drain terminal connected to the second terminal of the first magnetic tunnel junction device, and a second memory cell including a second magnetic tunnel junction device having a first terminal connected to a third bit line ($BLT_O$) and a second terminal, and a second field effect transistor (FET) having a source terminal connected to the second bit line (BLC), a gate terminal connected to the word line (WL), and a drain terminal connected to the second terminal of the second magnetic tunnel junction device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
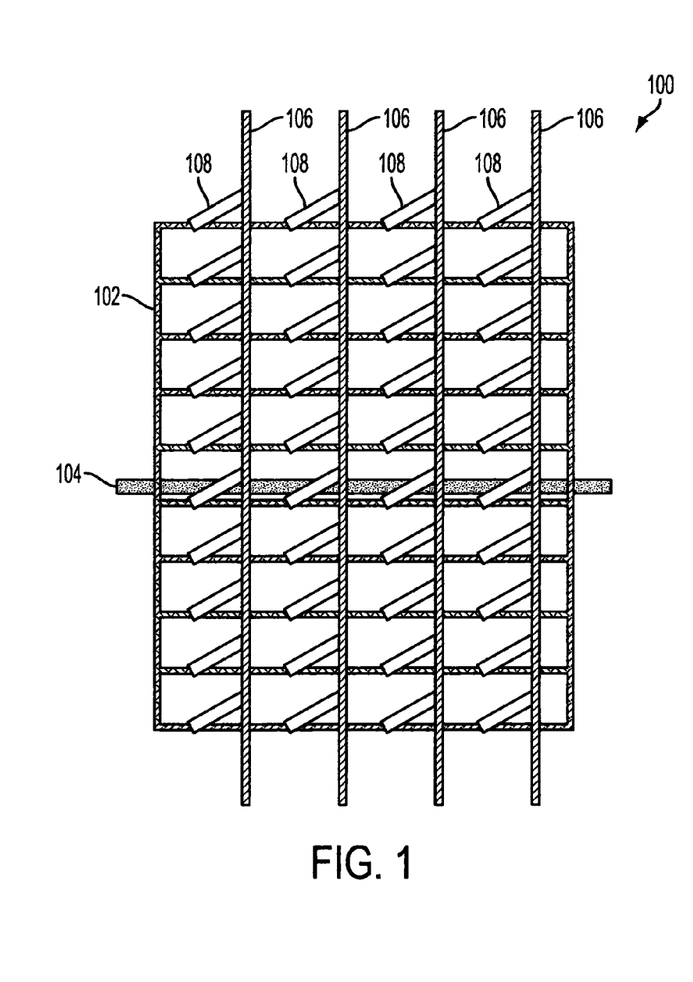
FIG. 1 illustrates an example of a single bit line memory array.
Figure 2:
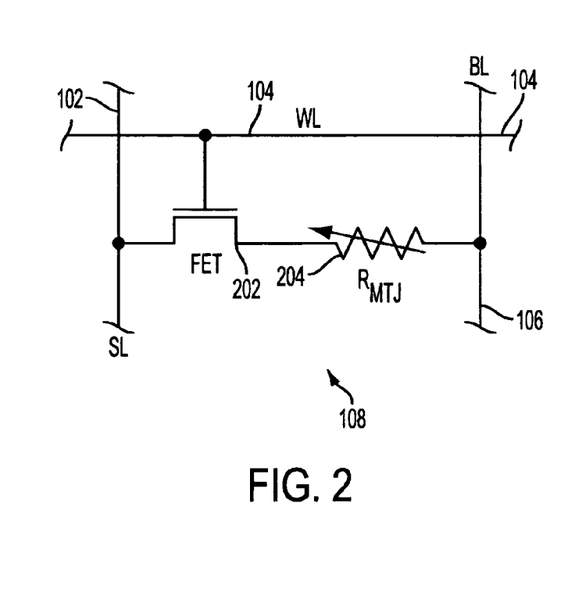
FIG. 2 illustrates an example of a cell of the single bit line memory array of FIG. 1.

FIG. 1 illustrates an example of a single bit line (SBL) memory array 100. The array 100 includes a source line (SL) arrangement 102, a word line (WL) 104, and a plurality of bit lines (BL) 106 connected to cells 108. FIG. 2 illustrates an example of a cell circuit diagram for a cell (memory subarray) 108 of the single bit line memory array 100. The cell 108 includes a field effect transistor (FET) 202 with a source terminal connected to the source line arrangement 102, a gate terminal connected to the word line 104, and a drain terminal connected to a magnetic tunnel junction device (MTJ) 204. The magnetic tunnel junction device 204 is connected to the bit line 106. The source terminals of the each of the FETs 202 in the cells 108 are connected to the source line arrangement 102. The source line 102 capacitance and resistance is large compared to the capacitance and resistance of the bit lines 106. In operation, unselected bit lines 106 consume power to avoid applying writing voltage across the MTJ 204 resulting in an undesirable disturb situation. A disturb situation may, for example, include an unintentional change in a state of cells 108. For example, it may be desirable to change a state of one cell 108 in the array 100 to a "1" state. In some instances, a MTJ 204 of another cell 108 may change states due to a voltage that may be present across the MTJ 204 since the cells 108 are connected to a common source line 102 in the array 100. The MTJ device 204 may include, for example, a fixed magnetic layer, a dielectric tunnel barrier, and a free magnetic layer. Data is written to the device by changing the magnetic orientation of the free magnetic layer using spin polarized current. Data may be read from the device by using, for example, parallel direction reading and anti-parallel direction reading.

Figure 3:
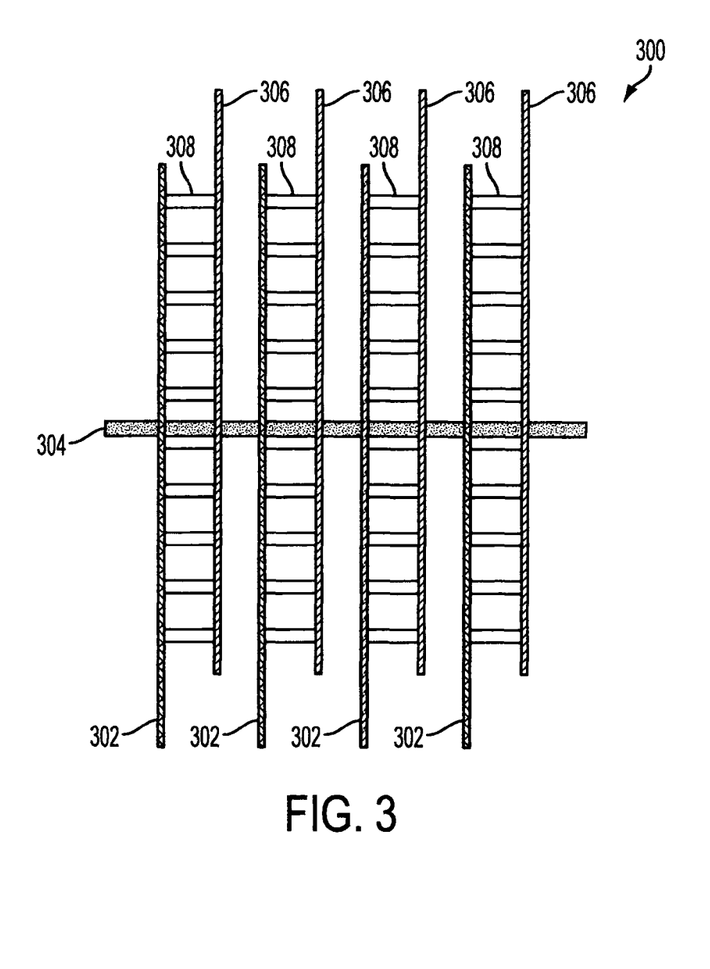
FIG. 3 illustrates an example of a double bit line memory array.
Figure 4:
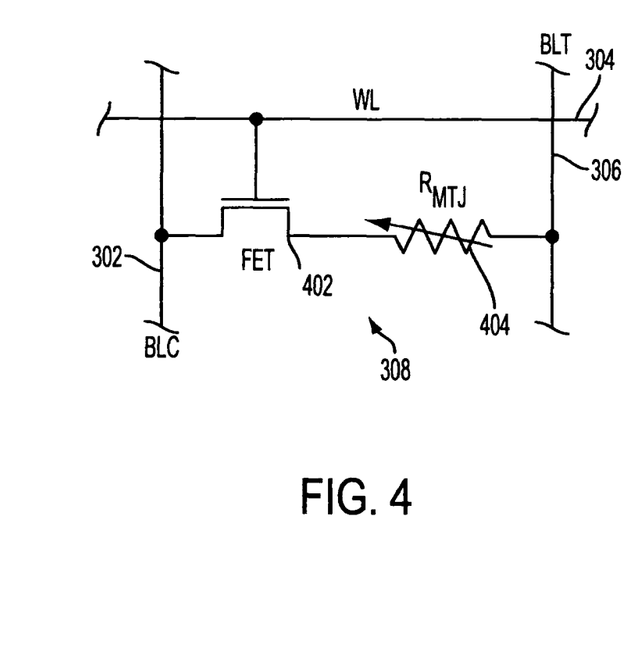
FIG. 4 illustrates an example of a cell of the double bit line memory array of FIG. 2.

FIG. 3 illustrates an example of a double bit line (DBL) memory array 300. The array 300 includes bit line compliments (BLC) 302, a word line 304, and bit lines true (BLT) 306 connected to cells 308. FIG. 4 illustrates an example of a cell circuit diagram for a cell 308 of the double bit line memory array 300. The cell 308 includes a FET 402 with a source terminal connected to the BLC 302, a gate terminal connected to the word line 304, and a drain terminal connected to a magnetic tunnel junction device 404. The magnetic tunnel junction device 404 is connected to the BLT 306. In the illustrated example, the independent bit lines BLC 302 and BLT 306 allow the unselected cells to function properly when the voltage of the bit lines of the unselected cells are the same. This arrangement reduces power consumption; however the cell size may be relatively larger due to the use of two bit lines.

Figure 5:
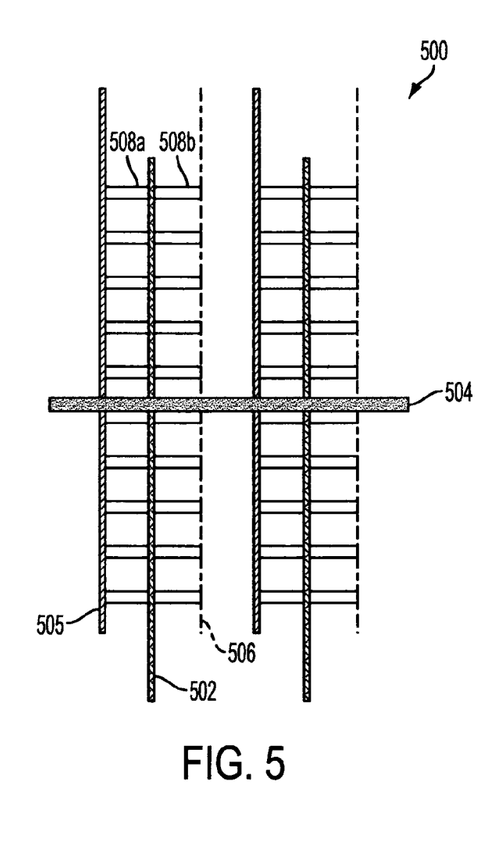
FIG. 5 illustrates an exemplary embodiment of a hybrid bit line memory array.
Figure 6:
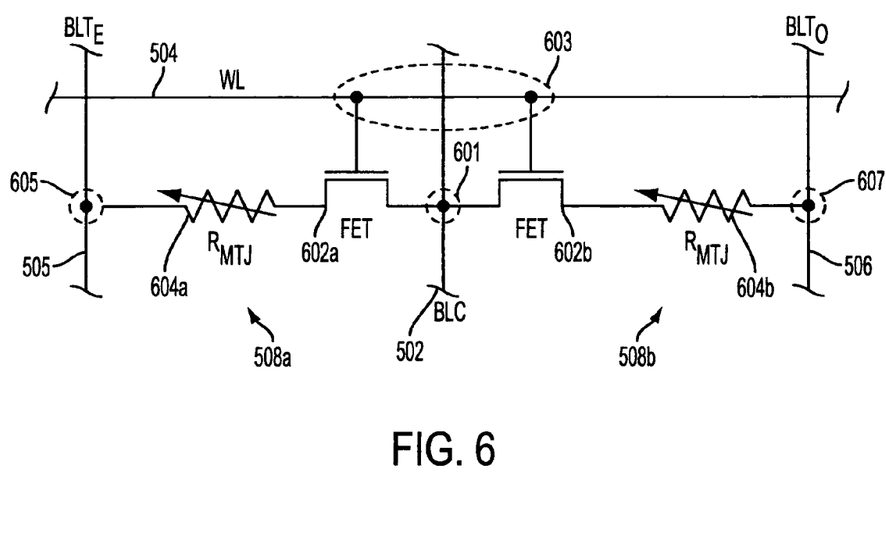
FIG. 6. illustrates an exemplary embodiment of cells of the hybrid bit line memory array of FIG. 5.

FIG. 5 illustrates an exemplary embodiment of a hybrid bit line (HBL) memory array 500. The array 500 includes a plurality of cells (memory sub-arrays) 508 (508a and 508b) that are connected to a first bit line (bit line true even ($BLT_E$)) 505, a second bit line (bit line true odd ($BLT_O$)) 506, a bit line compliment (BLC) 502, and a word line (WL) 504. FIG. 6 illustrates an exemplary embodiment of the cells 508a and 508b. In this regard, the cell 508a includes a FET 602a that may include an nFET or pFET device having a source terminal connected to the BLC 502 at a node 601, a gate terminal connected to the word line 504 at a node 603 and a drain terminal connected to a magnetic tunnel junction (MTJ) device 604a that is similar to the MTJ devices described above, including, for example, a fixed magnetic layer, a dielectric tunnel barrier, and a free magnetic layer (not shown). The MTJ device 604a is connected to the $BLT_E$ 505 at node 605. The cell 508b is similar to the cell 508a and includes a FET 602b having a source terminal connected to the BLC 502 at the node 601, a gate terminal connected to the WL 504 at the node 603, and a drain terminal connected to a MTJ device 604b. The MTJ device 604b is connected to the $BLT_O$ 506 at the node 607.

Figure 7:
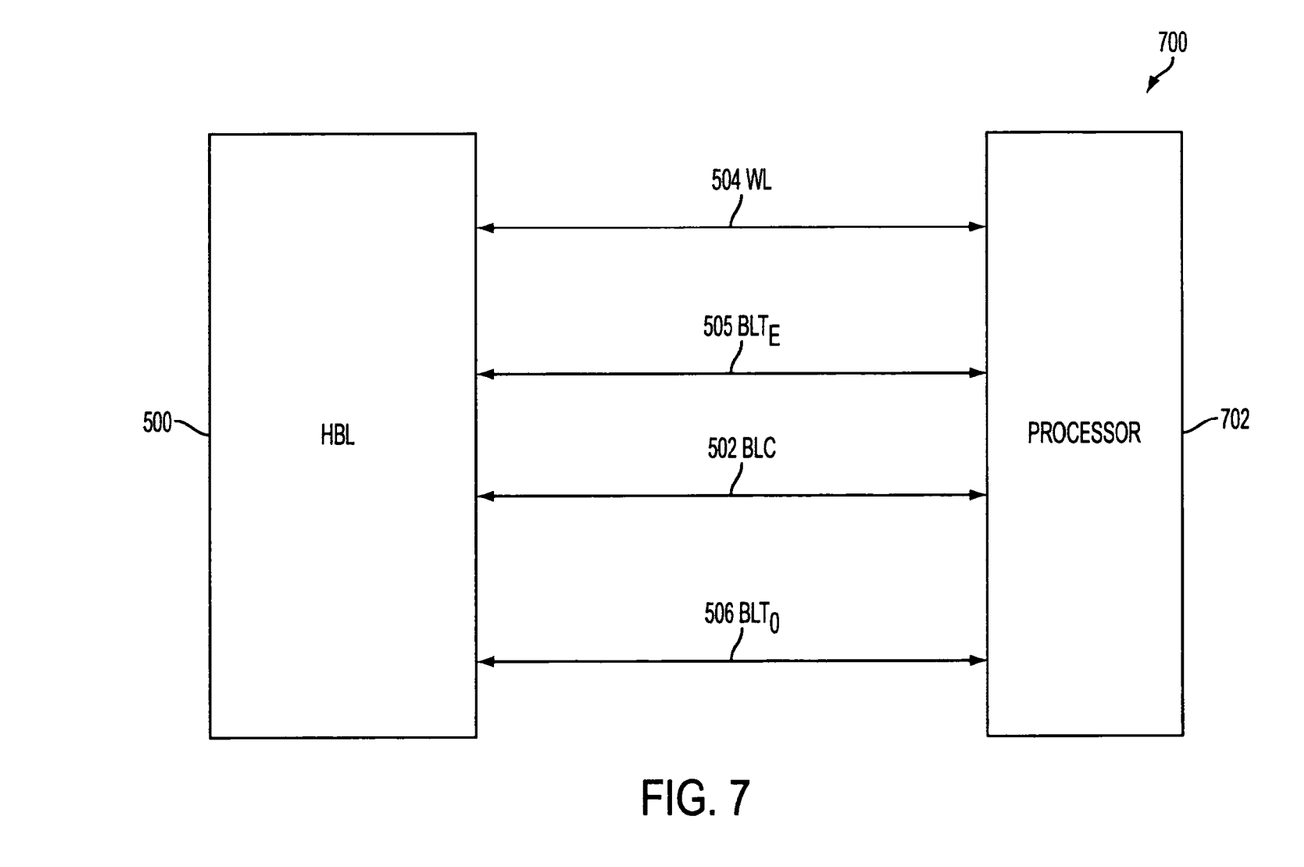
FIG. 7 illustrates a block diagram of a memory system.

FIG. 7 illustrates a block diagram of a system 700 including a processor 702 connected to the memory array 500. In operation, the processor 702 is operative to control the voltages of the lines 505, 506, 502, and 504 to change the states of cells 508 in the array 500.

Figure 8:
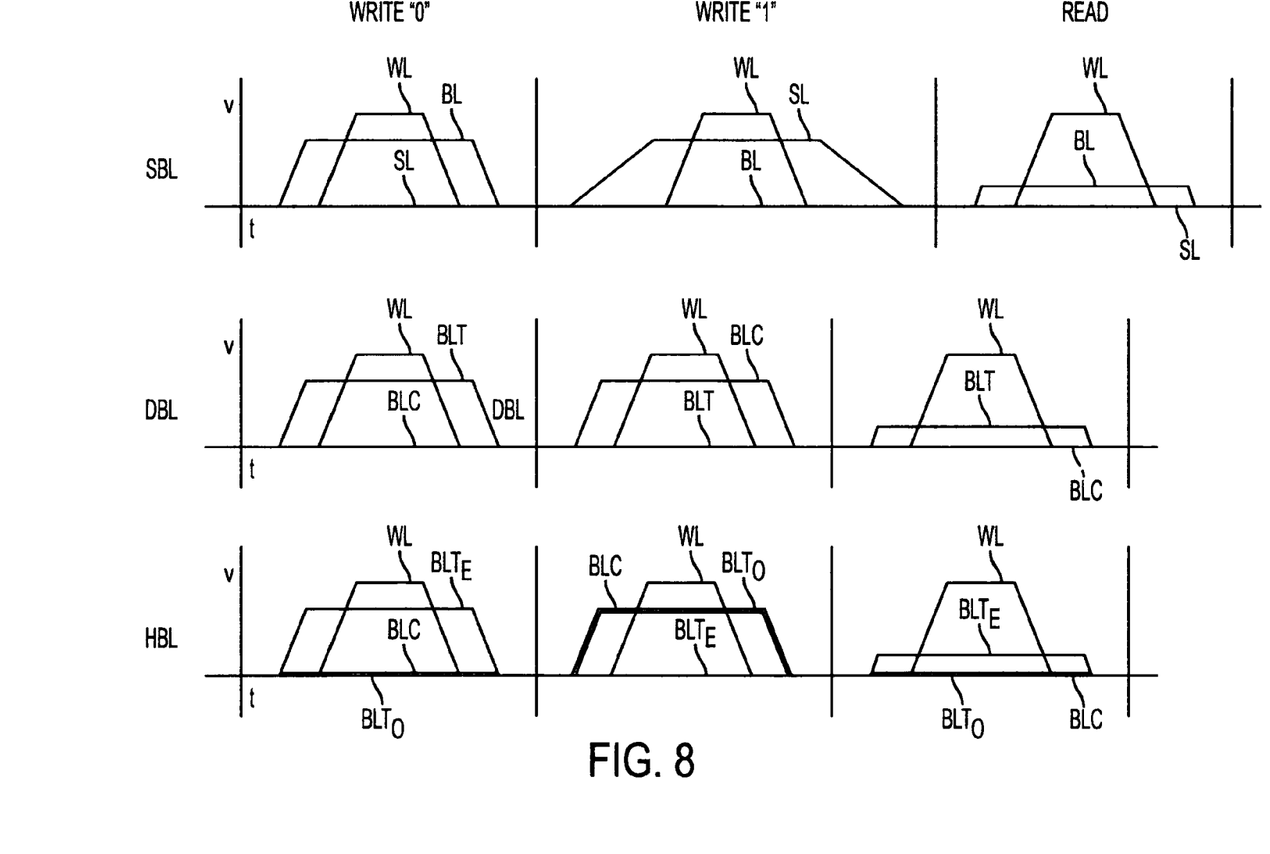
FIG. 8 illustrates a timing diagram including states of the single bit line memory array, the double bit line memory array, and the hybrid bit line memory array.

FIG. 8 illustrates a timing diagram that includes operating states for the SBL memory array 100 (of FIGS. 1 and 2), the DBL memory array 300 (of FIGS. 3 and 4), and the HBL memory array 500 (of FIGS. 5 and 6). The horizontal axis represents time (t) while the vertical axis represents voltage (v).

In this regard, for the SBL memory array in a write "0" state, the bit line (BL) voltage is high (e.g., 2.2-5.5 volts) and the source line (SL) voltage is low (e.g., 0 volts). In a write "1" state, the SL voltage is high and the BL voltage is low. In a read state, the SL voltage is low and the BL voltage is greater than 0, but less than the high voltage. The diagram illustrates the drive time in the write "1" state for the SL is relatively long resulting in a long cycle time.

Referring to the DBL memory array, in a write "0" state, the BLT voltage is high and the BLC voltage is low. In the write "1" state, the BLC voltage is high and the VLT voltage is low. In the read state, the BLC voltage is low and the BLT voltage is greater than 0 but less than the high voltage. The BLC drive time is reduced relative to the SL drive time of the SBL memory described above.

In an exemplary method for operating the HBL array 500 (of FIG. 5), in the write "0" state, the word line voltage is high, the $BLT_E$ voltage is high, the BLC voltage is low, and the $BLT_O$ voltage is low. In the write "1" state, the word line voltage is high, the $BLT_E$ voltage is low, the BLC voltage is high, and the $BLT_O$ voltage is high. In the read state, the word line voltage is high, the $BLT_E$ voltage is greater than 0 but less than the high voltage, the BLC voltage is low, and the $BLT_O$ voltage is low. In the write "1" state, the drive time for the BLC and $BLT_O$ is relatively shorter than the drive time for the write "1" state of the SBL array 100 (of FIG. 1).

Figure 9:
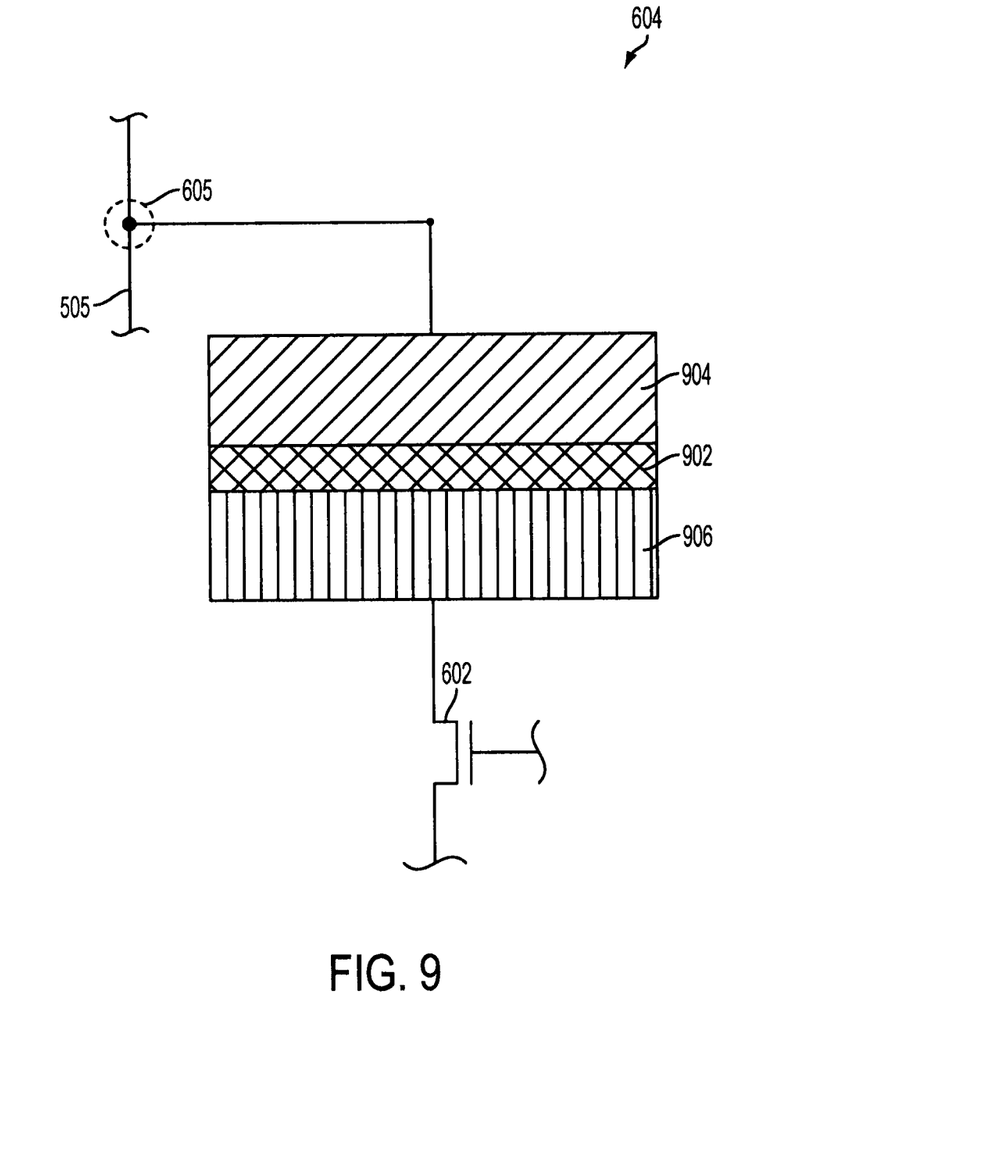
FIG. 9 illustrates a side cut-away view of an example of a magnetic tunnel junction device.

FIG. 9 illustrates a side cut-away view of an example of a MTJ device similar to the MTJ device 604 described above. In this regard, the MTJ device 604 includes a thin dielectric tunnel barrier 902 disposed between a free magnetic layer 904 and a fixed magnetic layer 906. In the illustrated embodiment, the free magnetic layer 904 is connected to the node 605, and the fixed magnetic layer 906 is connected to the FET 602.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A memory system comprising:
a processor; and
a memory array communicatively connected to the processor, the memory array comprising:
  a first memory cell comprising:
    a first magnetic tunnel junction device having a first terminal connected to a first bit line ($BLT_E$) and a second terminal; and
    a first field effect transistor (FET) having a source terminal connected to a second bit line (BLC), a gate terminal connected to a word line (WL), and a drain terminal connected to the second terminal of the first magnetic tunnel junction device; and
  a second memory cell comprising:
    a second magnetic tunnel junction device having a first terminal connected to a third bit line ($BLT_O$) and a second terminal; and
    a second field effect transistor having a source terminal connected to the second bit line, a gate terminal connected to the word line, and a drain terminal connected to the second terminal of the second magnetic tunnel junction device.

2. The device of claim 1, wherein the first magnetic tunnel junction device includes a dielectric tunnel barrier layer disposed between a free magnetic layer and a fixed magnetic layer.

3. The device of claim 1, wherein the first field effect transistor is an nFET device.

4. The device of claim 1, wherein the second field effect transistor is an nFET device.

5. The device of claim 1, wherein the first memory cell and the second memory cell of the device are operative to enter a write "0" state when a voltage is applied to the word line and the first bit line ($BLT_E$).

6. The device of claim 1, wherein the first memory cell and the second memory cell of the device are operative to enter a write "1" state when a voltage is applied to the word line, the second bit line (BLC), and the third bit line ($BLT_O$).

7. The device of claim 1, wherein the first memory cell and the second memory cell of the device are operative to enter a read state when a voltage is applied to the word line and the first bit line ($BLT_E$).

8. The device of claim 7, wherein the voltage applied to the first bit line ($BLT_E$) in the read state is less than a voltage applied to the first bit line ($BLT_E$) in a write "0" state.

* * * * *